(12) United States Patent
Richter et al.

(10) Patent No.: US 11,430,378 B2
(45) Date of Patent: Aug. 30, 2022

(54) DISPLAY AND MANUFACTURING METHOD FOR A DISPLAY

(71) Applicant: OSRAM OLED GmbH, Regensburg (DE)

(72) Inventors: Jens Richter, Hemau (DE); Kilian Regau, Regensburg (DE); Patrick Hörner, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 17/264,661

(22) PCT Filed: Aug. 21, 2019

(86) PCT No.: PCT/EP2019/072382
§ 371 (c)(1),
(2) Date: Jan. 29, 2021

(87) PCT Pub. No.: WO2020/039002
PCT Pub. Date: Feb. 27, 2020

(65) Prior Publication Data
US 2021/0335218 A1 Oct. 28, 2021

(30) Foreign Application Priority Data
Aug. 24, 2018 (DE) ................. 10 2018 120 730.1

(51) Int. Cl.
*G09G 3/32* (2016.01)
*G09G 3/00* (2006.01)
(Continued)

(52) U.S. Cl.
CPC ............. *G09G 3/32* (2013.01); *G09G 3/006* (2013.01); *H01L 25/0753* (2013.01);
(Continued)

(58) Field of Classification Search
CPC .. G09G 3/32; G09G 3/006; G09G 2300/0443; G09G 2300/0452;
(Continued)

(56) References Cited

U.S. PATENT DOCUMENTS

| 5,260,818 A | 11/1993 | Wu | |
|---|---|---|---|
| 2002/0036471 A1* | 3/2002 | Silvestre | G09G 3/30 315/160 |
| 2007/0215854 A1* | 9/2007 | Chou | H05B 45/40 257/13 |
| 2014/0139499 A1 | 5/2014 | Hussain et al. | |

(Continued)

FOREIGN PATENT DOCUMENTS

| JP | H8-137413 A | 5/1996 | |
|---|---|---|---|
| WO | 2017/167812 A1 | 10/2017 | |
| WO | WO-2017167812 A1 * | 10/2017 | ............. H01L 33/24 |

OTHER PUBLICATIONS

International Search Report issued for corresponding International Patent Application No. PCT/EP2019/072382 dated Oct. 31, 2019, along with an English translation.

(Continued)

*Primary Examiner* — Kenneth B Lee, Jr.
(74) *Attorney, Agent, or Firm* — Hauptman Ham, LLP

(57) ABSTRACT

A display includes a plurality of pixels. The pixels include at least one emitter unit. The emitter units each include a primary emitter and a secondary emitter for generating light of the same color. The secondary emitter is associated with the primary emitter of the corresponding emitter unit. The primary emitters and the secondary emitters are based on at least one semiconductor material. The emitter units each include a correction circuit. The correction circuits are each configured to be able to switch the generation of light from the primary emitter to the associated secondary emitter in case of a defect of the associated primary emitter.

15 Claims, 6 Drawing Sheets

(51) Int. Cl.
  *H01L 25/075* (2006.01)
  *H01L 27/12* (2006.01)
  *H01L 33/00* (2010.01)
  *H01L 33/62* (2010.01)

(52) U.S. Cl.
  CPC ...... *H01L 27/1255* (2013.01); *H01L 33/0095* (2013.01); *H01L 33/62* (2013.01); *G09G 2300/0443* (2013.01); *G09G 2300/0452* (2013.01); *G09G 2300/08* (2013.01); *G09G 2330/08* (2013.01); *G09G 2330/10* (2013.01)

(58) Field of Classification Search
  CPC ........... G09G 2300/08; G09G 2330/08; G09G 2330/10; H01L 25/0753; H01L 27/1255; H01L 33/0095; H01L 33/62
  See application file for complete search history.

(56) References Cited

U.S. PATENT DOCUMENTS

| | | |
|---|---|---|
| 2014/0319486 A1 | 10/2014 | Hong |
| 2015/0264757 A1 | 9/2015 | Aliakseyeu et al. |
| 2016/0190110 A1 | 6/2016 | Göötz et al. |
| 2017/0309224 A1 | 10/2017 | Pappas et al. |
| 2017/0352321 A1 | 12/2017 | Hodges et al. |
| 2018/0007750 A1 | 1/2018 | Meitl et al. |

OTHER PUBLICATIONS

Written Opinion issued for corresponding International Patent Application No. PCT/EP2019/072382 dated Oct. 31, 2019.

Search Report issued for corresponding German Patent Application No. 10 2018 120 730.1 dated Jan. 14, 2019, along with an English translation.

\* cited by examiner

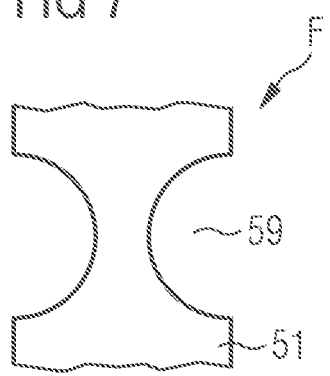
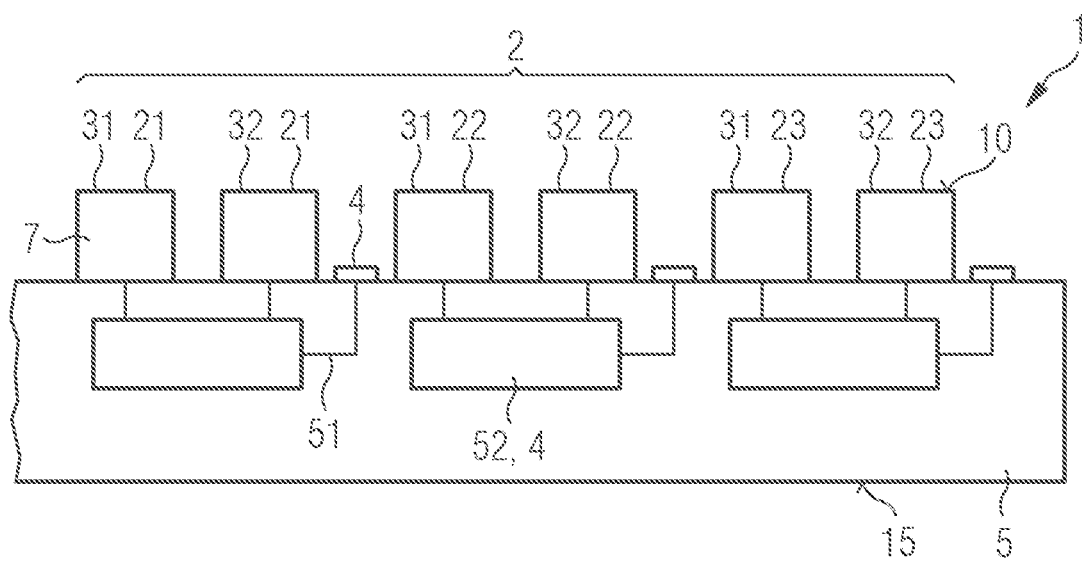

DISPLAY AND MANUFACTURING METHOD FOR A DISPLAY

CROSS REFERENCE TO RELATED APPLICATION

This application is a National Stage of International Application No. PCT/EP2019/072382, filed on Aug. 21, 2019, which designates the United States and was published in Europe, and which claims priority to German Patent Application No. 10 2018 120 730.1, filed on Aug. 24, 2018, in the German Patent Office. Both of the aforementioned applications are hereby incorporated by reference in their entireties.

A display is specified. Furthermore, a manufacturing method for a display is specified.

The publication WO 2017/167812 A1 concerns an LED module with redundant subpixels.

A display with micro LEDs is known from the publication US 2016/0190110 A1.

US 2007/0215854 A1, US 2014/0139499 A1 and US 2015/0264757 A1 refer to methods for correcting the light emission of an LED array in case of single defective LED units.

One task to be solved is to specify a display where the effects of defective subpixels can be corrected efficiently.

This task, among others, is solved by a display and by a manufacturing method with the features of the independent patent claims. Preferred further developments are subject of the dependent claims.

In particular, the display described here includes redundant subpixels that can be used for light emission via a correction circuit instead of a primary emitter, for example by enabling them by means of the correction circuit.

According to at least one embodiment, the display comprises a plurality of pixels. The pixels are configured to emit light, in particular colored light, according to a drive signal. The pixels can be RGB pixels, which comprise subpixels for the generation of green light, red light, and blue light. By means of the pixels, the display can show colored images and/or movies.

According to at least one embodiment, at least some of the pixels comprise an emitter unit. Preferably at least half of the pixels or at least 90% of the pixels or all pixels comprise an emitter unit. The emitter unit can form a subpixel. Thus the emitter unit is in particular configured to generate red light, blue light or green light.

Preferably, each subpixel of the pixels is formed by a corresponding emitter unit. This means that there can be one red emitting emitter unit per pixel as well as one blue emitting emitter unit and one green emitting emitter unit.

According to at least one embodiment, the emitter units each comprise at least one primary emitter and at least one secondary emitter. The primary emitter(s) and secondary emitter(s) are configured to produce light of the same color. The at least one secondary emitter is assigned to the at least one primary emitter of the respective emitter unit. In particular, the emitter units each comprise exactly one primary emitter and exactly one secondary emitter.

According to at least one embodiment, the primary emitters and the secondary emitters are based on one or more semiconductor materials. In particular, the primary emitters and the secondary emitters assigned to each other are based on the same semiconductor material. For this purpose, the primary emitters and the secondary emitters preferably each comprise a semiconductor layer sequence. The primary emitters and the secondary emitters can be formed from the same semiconductor layer sequence. In particular, the primary emitters and the secondary emitters are formed as light emitting diode units, in short LED units.

The semiconductor layer sequences are preferably based on at least one III-V compound semiconductor material. The at least one semiconductor material is for example a nitride compound semiconductor material like $Al_nIn_{1-n-m}Ga_mN$ and/or a phosphide compound semiconductor material like $Al_nIn_{1-n-m}Ga_mP$ and/or around an arsenide compound semiconductor material such as $Al_nIn_{1-n-m}Ga_mAs$ or such as $Al_nGa_mIn_{1-n-m}As_kP_{1-k}$, where $0 \leq n \leq 1$, $0 \leq m \leq 1$ and $n+m \leq 1$ and $0 \leq k < 1$, respectively. Preferably for at least one layer or for all layers of the semiconductor layer sequence $0 < n \leq 0.8$, $0.4 \leq m < 1$ and $n+m \leq 0.95$ as well as $0 < k \leq 0.5$. The semiconductor layer sequence may comprise dopants as well as additional components. However, for the sake of simplicity, only the essential constituents of the crystal lattice of the semiconductor layer sequence, i.e. Al, As, Ga, In, N or P, are specified, even if these may be partially replaced and/or supplemented by small amounts of other substances.

According to at least one embodiment, the emitter units each comprise one or more correction circuits, in particular exactly one correction circuit. The correction circuit is configured to be able to switch the generation of light from the primary emitter to the associated secondary emitter in case of a defect of the primary emitter. This switching can be done automatically or by modifying or adapting the correction circuit, for example by interrupting or adding electrical connections and/or by switching through or blocking switching units such as transistors, in particular field-effect transistors. The transistors are preferably designed as thin-film transistors, TFT for short, especially in or on the carrier.

In at least one embodiment, the display comprises a plurality of pixels. At least some of the pixels comprise an emitter unit. The emitter units each comprise a primary emitter and a secondary emitter for generating light of the same color, wherein the secondary emitter is associated to the primary emitter of the corresponding emitter unit. The primary emitters and the secondary emitters are based on at least one semiconductor material. Furthermore, the emitter units each comprise a correction circuit. The correction circuits are each configured to be able to switch the generation of light from the primary emitter to the assigned secondary emitter in case of a defect of the corresponding primary emitter.

The displays described here are preferably micro LED active matrix displays, where each pixel corresponds to a cell with three LED units, corresponding to the subpixels. The three LED units are preferably one red, one green and one blue emitting LED unit. The LED units within the cells, i.e. within the pixels, are especially operated with a constant current, for example by pulse width modulation.

A faulty assembly of the display panel with micro LEDs or defects within the LED units can lead to a reduced operating voltage or even a short circuit for individual LEDs. In the following, this case can also be referred to as "short", whereby the resistance is then comparatively low compared to functional LED units and can be considered as approaching zero.

On the other hand, such errors or defects in individual LED units can lead to an increased operating voltage up to an open contact. This case can also be called "open" in the following, because the resistance of the corresponding LED unit is significantly increased compared to functioning LED units and can be considered as going towards infinity.

In particular, the errors or defects are not or only to a small extent caused by the LED units themselves, but originate entirely or predominantly from the assembly and/or electrical contacting of the LED units.

If one of these two cases occurs, the LED unit in question can no longer be operated with the given parameters and the corresponding cell, i.e. the corresponding pixel, is considered defective.

If an "open" occurs in a parallel connection of LED units, more current flows through the additional LED unit. If it is a so-called real "open" with R→∞, all current flows through the additional LED unit and the corresponding pixel is intact. However, if a "short" occurs in this circuit at one of the LEDs, more current flows through this branch. If it is a so-called real "short" with R→0, the complete current flows over this branch and none of the LED units emit light. It is therefore not possible to identify which of the two LED units comprises a "short" in a pure parallel connection.

If a real "open" occurs in a series connection with one of the two LED units with R→∞, then none of the two LED units has current flowing through it and the pixel is defective. If a real "short" with R→0 occurs in one of the LED units in this circuit, the second LED unit can be operated properly and the pixel is intact.

Neither with a pure series connection nor with a pure parallel connection of LED units, the two mentioned error cases, i.e. "short" or "open", can be intercepted permanently. In addition, the above consideration for conventional, pure parallel and series connections is strictly speaking only valid if an ideal "short" or "open" is present with R=0 or R=∞. If this is not the case, further process steps are necessary to separate the defective branches. In particular in case of pure parallel and series connections, additional sequential process steps may be necessary to achieve the desired operating parameters and the desired radiation characteristics even if both LED units are functional.

In order to solve the problems associated with pure parallel circuits and series circuits, the display described here comprises the correction circuits, which can be realized in various ways. Thus, parallel circuits and series circuits of redundantly implemented LED units can be used efficiently to correct an emission characteristic and to repair otherwise defective pixels.

Thus, in particular by circuit engineering measures, a defect density in the display can be significantly reduced. One of two LED units can be chosen as the preferred LED unit, corresponding to the primary emitter. This makes it possible that in case the primary emitter is functional, no further measures have to be taken. If the primary emitter is faulty, the second LED unit, i.e. the secondary emitter, is activated by a measure to be taken. Such measures are, for example, the lasering of conductor tracks, so-called electrically caused burn-in processes for the shorting of fuse units or similar.

With the display described here, it is therefore possible to intercept error cases such as "shorts" and "opens" in pixels. A realization in an active matrix structure is possible. Due to the redundancy of the LED units in the emitter units, significant increases in the yield during production are possible. The circuit designs make an additional repair process step on the correction circuit preferably only necessary if an LED unit is defective, especially if the primary emitter is defective.

According to at least one embodiment, the secondary emitters are each uniquely assigned to one of the primary emitters. Thus, there is a 1:1 assignment between the secondary emitters and the primary emitters. Preferably the primary and secondary emitters are identical in construction. This means that within the manufacturing tolerances there are preferably no or no significant differences between the primary emitter and the assigned secondary emitter.

According to at least one embodiment, the secondary emitter of the respective emitter unit does not emit light as long as the correction circuit is not actuated. This means that the secondary emitter is then inactive by default.

Alternatively, it is possible that both the primary emitter and the secondary emitter are configured for radiation emission and light generation if the correction circuit has not yet been actuated. In this case, one of the emitters is deactivated if the correction circuit is actuated.

If both the primary emitter and the secondary emitter are active as long as the correction circuit is not actuated, the roles of the primary emitter and the secondary emitter may be interchanged, i.e. primary emitter and secondary emitter may be equal and/or indistinguishable when the correction circuit is not actuated. In other words, the division into primary emitter and secondary emitter is then without meaning for the status as primary or secondary light source.

According to at least one embodiment, the correction circuit comprises one or more transistors, one or more fuses and/or one or more antifuses. Fuses are also called severable fuses, antifuses are also called anti-fuses. Antifuses can be found in the Wikipedia entry "Antifuse". The term "severable fuses" or "fuses" covers fuses that are severed by mechanical or optical processing such as laser irradiation as well as fuses that break automatically when the current is too high.

According to at least one embodiment, the primary emitter and the associated secondary emitter of an emitter unit are electrically connected in series.

According to at least one embodiment, an antifuse is electrically connected in parallel to each primary emitter in each emitter unit. Alternatively or additionally, a fuse is electrically connected in parallel to the secondary emitter. This applies in particular in the case that the primary emitter and the secondary emitter are electrically connected in series.

According to at least one embodiment, a field-effect transistor is electrically connected in parallel to each primary emitter in each emitter unit. Alternatively or additionally, a fuse is electrically connected in parallel to the secondary emitter. This is especially true if the primary emitter and the assigned secondary emitter are electrically connected in series.

According to at least one embodiment, a control electrode of the field-effect transistor is connected to a negative as well as to a positive supply voltage as long as the correction circuit is not actuated. For example, a resistor may be placed between the negative supply voltage and the control electrode.

According to at least one embodiment, the control electrode of the field-effect transistor is only connected to the negative supply voltage after the correction circuit has been actuated. Thus, after the correction circuit has been activated, there is preferably a fuse between the control electrode, also called gate, and the positive supply voltage.

According to at least one embodiment, a resistor and the secondary emitter are assigned a common electrode with low-resistance. This in particular applies when the primary emitter and the assigned secondary emitter are connected in series. The resistor preferably connects only one control electrode of a transistor assigned to the primary emitter with the negative supply voltage in order to drive through the transistor when a fuse is severed.

According to at least one embodiment, the primary emitter and the associated secondary emitter are electrically connected in parallel. This means here and in the following in particular that the primary emitter and the assigned secondary emitter are connected with low-resistance to a common electrode, in particular to a common cathode.

According to at least one embodiment, all primary emitters and all secondary emitters or groups of primary emitters and associated secondary emitters are connected in a low-resistance manner to a common electrode, in particular to a common cathode, at least as long as the associated correction circuit has not yet been actuated. The term "group" means in particular at least 100 or 1000 or 10000 primary emitters and associated secondary emitters.

According to at least one embodiment, a first fuse and the primary emitter are electrically connected in series.

According to at least one embodiment, the secondary emitter and a field-effect transistor are electrically connected in series. This means in particular that the secondary emitter is electrically connected to an emitter of the field-effect transistor, also called drain. This is the case, for example, when the primary emitter and the secondary emitter are electrically connected in parallel.

According to at least one embodiment, a control electrode of the field-effect transistor, which is electrically connected in series with the secondary emitter, is connected to a positive supply voltage via a second fuse and/or to a negative supply voltage via a resistor.

According to at least one embodiment, the first and the second fuse are still connected through as long as the correction circuit has not been activated. This means that the first and the second fuse are severed when the correction circuit is actuated and the corresponding electrical connections are interrupted. The term "not yet actuated" refers in particular to the correction circuit in its original state, as originally manufactured. The original state is preferably permanent for the functioning emitter units.

According to at least one embodiment, the primary emitter and the secondary emitter are each electrically connected in series with a fuse. This applies in particular when the primary emitter is connected in parallel to the secondary emitter.

According to at least one embodiment, the primary emitter and the secondary emitter are each electrically connected to a field-effect transistor with low-resistance as long as the correction circuit has not been actuated. After actuation of the correction circuit, this applies preferably only either to the primary emitter or to the secondary emitter. In particular, "low-resistance" means a direct electrical connection via an electrical conductor track without intermediate dedicated resistors or other electrical components such as capacitors or coils or transistors.

In particular, low-resistance means a conductor resistance or connection resistance of at most $10\Omega$ or $3\Omega$ or $1\Omega$.

According to at least one embodiment, the field-effect transistor is connected to the primary emitter and the secondary emitter with low-resistance before the correction circuit is actuated. The transistor can be connected in a source circuit. The control electrode, also called gate, can be connected to a variable control voltage. When actuating the correction circuit, the control voltage is preferably lower than in regular operation of the corresponding pixel of the display.

According to at least one embodiment, the correction circuits of the emission units are partially or completely freely accessible from an emission side of the display. This applies to a part of the correction circuits or to all correction circuits. This makes it possible to operate the correction circuits from the emission side.

According to at least one embodiment, the correction circuits of the emission units are partially or completely freely accessible from a rear side of the display. The rear side is opposite to the emission side and in intended operation, no light generated in the display is emitted at the rear side. This applies to some or all correction circuits.

Preferably, the correction circuit is only partially freely accessible. In particular, only the fuses, which are intended to be opened, for example by means of laser radiation, are freely accessible, in particular on an outside surface of the carrier, and optionally electrical conductor tracks as supply elements for such fuses. The same may apply to antifuses and to fuses that can be severed purely electrically, but this need not be the case. In particular, a transistor of the correction circuit may be physically separated from the fuse and may be located inside the carrier.

According to at least one embodiment, the primary emitters and the secondary emitters are each formed by individual LED chips. Alternatively, the primary emitters and the secondary emitters can have a common semiconductor layer sequence and/or be monolithically integrated.

In addition, a manufacturing method for a display is specified, in particular for a display as described in connection with one or more of the embodiments mentioned above. Features of the display are therefore also disclosed for the manufacturing method and vice versa.

In at least one embodiment, the manufacturing method comprises the following steps, preferably in the order given:
  Providing of the emitter units with the correction circuits, wherein the correction circuits have not yet been actuated;
  Testing the emitter units, determining whether at least one primary emitter is defective and, if so, which primary emitter or primary emitters are defective; and
  Actuating at least those correction circuits to which a defective primary emitter is assigned, so that the associated secondary emitter is permanently configured for light generation.

As an alternative to switching over from the primary emitter to the secondary emitter by actuating the respective correction circuits, it is also possible that actuating the correction circuit means that the secondary emitter is switched off and emission occurs only via the primary emitter. In this case, if the correction circuit is not actuated, both the primary emitter and the secondary emitter can emit light.

According to at least one embodiment, the at least one defective primary emitter comprises an electrical resistance increased by at least a factor of 3 or 5 or 10 or 100 compared to functional primary emitters. Alternatively, the electrical resistance of the defective primary emitter is lower by at least a factor of 2 or 5 or 10 or 100 compared to the functional primary emitters. The display may show primary emitters with increased resistance as well as primary emitters with decreased resistance, depending on the defect or failure of the primary emitter in question.

For example, the percentage of defective primary emitters in the display, relative to a number of total primary emitters, is at most 0.2% or 1% or 5%. Alternatively or additionally, this percentage of defective primary emitters is at least $10^{-6}$ or $10^{-5}$ or $10^{-4}$ or 1 permille or 3 permille.

In the following, a display described here is explained in more detail with reference to the drawing using exemplary embodiments. Identical reference signs specify identical elements in the individual figures. However, no scale references are shown, individual elements may be oversized for better understanding.

In the figures:

FIG. 7 shows a schematic top view of a fuse.

Figure 9:
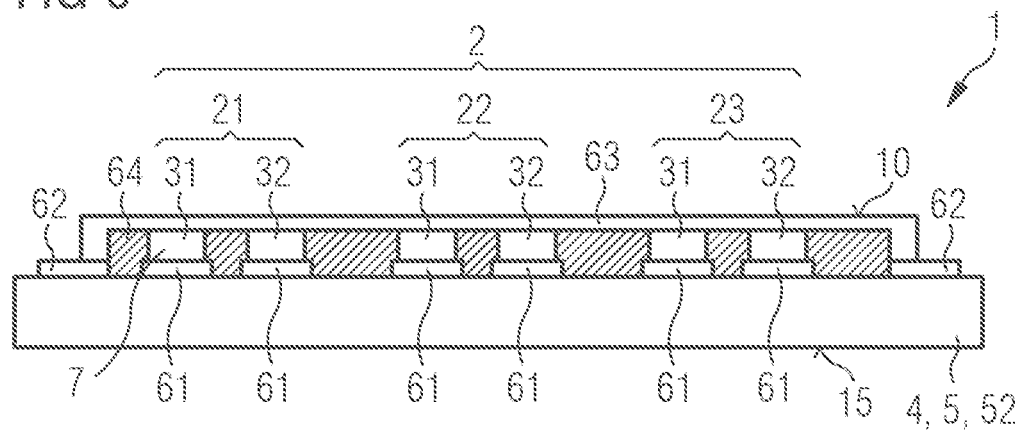

FIGS. 8 and 9 schematic sectional views of exemplary embodiments of the displays described here.

Figure 10:
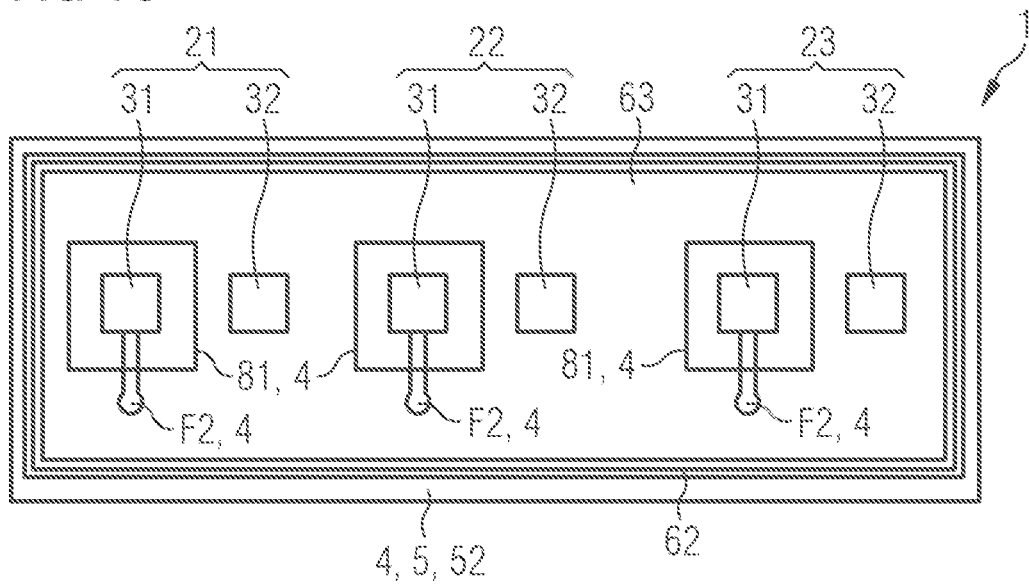
Figure 11:
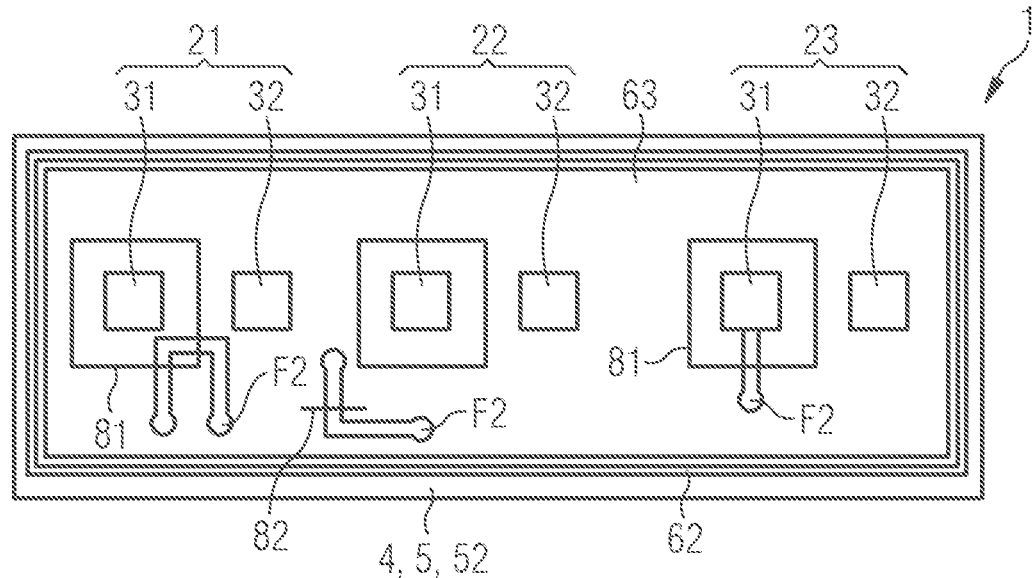
Figure 12:
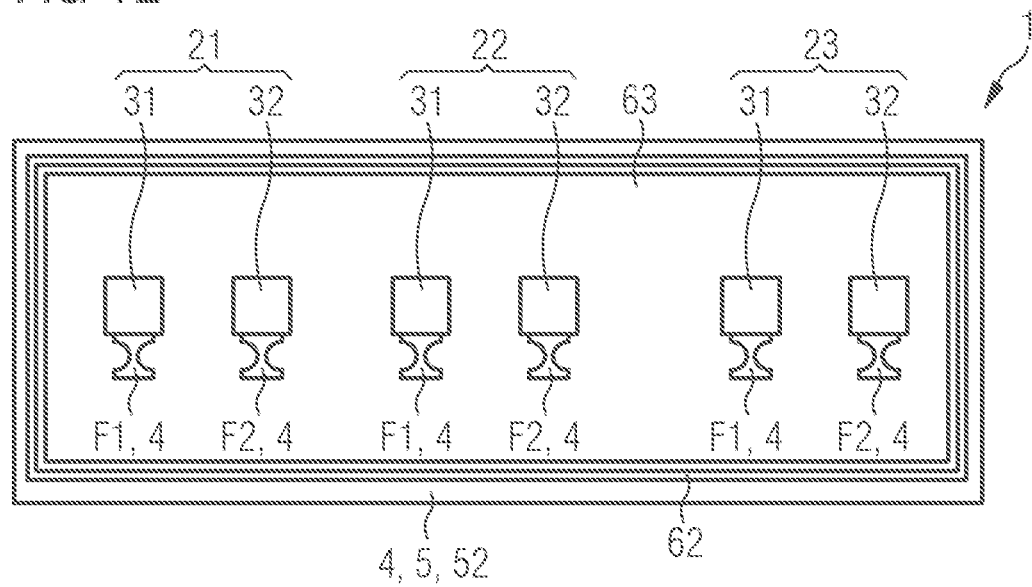

FIGS. 10 to 12 schematic top views of exemplary embodiments of the displays described here.

Figure 1:
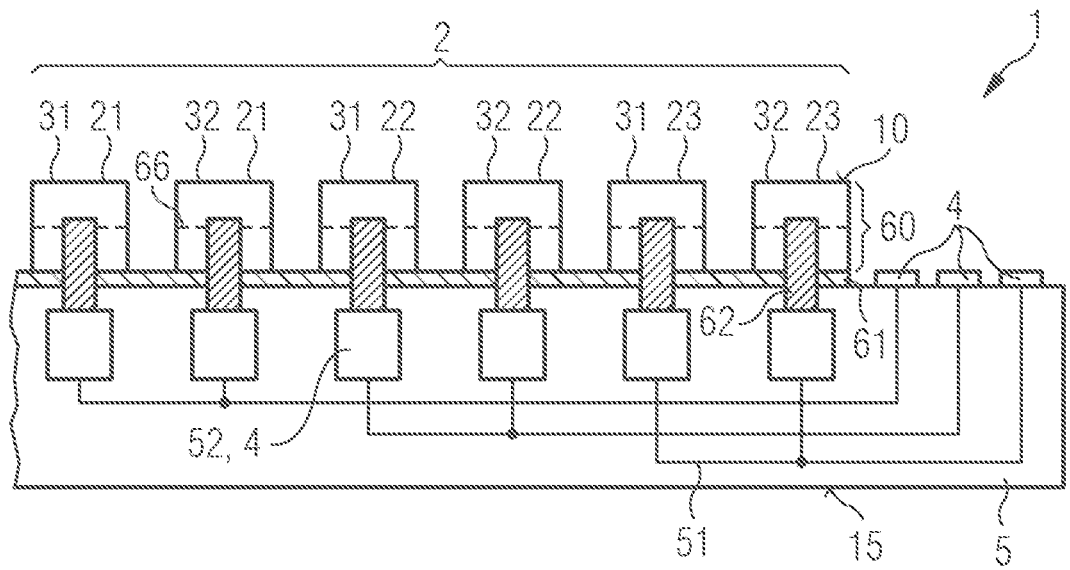
FIG. 1 shows a schematic sectional view of an exemplary embodiment of a display described here.

FIG. 1 shows an exemplary embodiment of a display 1. The display 1 comprises a plurality of pixels 2. To simplify the representation only one pixel 2 is drawn. The pixel 2 comprises an emitter unit 21 for generating red light, an emitter unit 22 for generating green light and an emitter unit 23 for generating blue light. The emitter units 21, 22, 23 can be operated independently from each other. Therefore the emitter units 21, 22, 23 comprise a semiconductor layer sequence 60. The emitter units 21, 22, 23 can be made of the same semiconductor layer sequence 60. Especially the semiconductor layer sequence 60 is based on the material system AlInGaN and/or AlInGaP. Therefore the display 1 can be a μLED display.

For the adjustment of the emission colors non-drawn phosphors may be present, in particular for the generation of green and red light by full conversion from blue light or for the generation of green, red and blue light by full conversion from UV radiation.

The semiconductor layer sequence 60 comprises an active zone 66 for radiation generation. It is possible that second contact electrodes 62 pass through the active zone 66 from a rear side 15 to an emission side 10. Thus, in particular an n-side of the semiconductor layer sequence 60 is electrically contacted at a side facing away from a carrier 5 close to the emission side 10 via the second contact electrodes 62.

In particular, a p-side of the semiconductor layer sequence 60 on the carrier 5 can be contacted via, for example, a planar first contact electrodes 61. The first contact electrode 61 can extend continuously over all emitter units 21, 22, 23. To simplify the illustration, electrical insulations between the contact electrodes 61, 62 are not drawn. The second contact electrodes 62 are formed in particular as cathode and the first contact electrode 61 accordingly as anode.

The emitter units 21, 22, 23 are controlled, for example, via control circuits 52, which may be integrated in carrier 5. The carrier 5 is, for example, a silicon carrier. Alternatively, the carrier 5 may be a printed circuit board, for example. The control circuits 52 comprise in particular transistors, current sources, interfaces, address units and/or memory modules.

The carrier 5 can also be a so-called backplane made of glass or polyimide with applied semiconductor layers for the transistors, in short TFT for thin film transistor, and with structures made of indium-gallium-zinc-oxide, in short IGZO, and/or of low-temperature silicon, also known as Low Temperature Poly Silicon or in short LIPS. This also applies to all other exemplary embodiments.

Deviating from the illustration in FIG. 1, it is also possible that the second contact electrode 62 is limited to individual emitters 31, 32 and that the second contact electrodes 62 are connected as a common cathode. This means that the first contact electrodes 61, which are then individual, can in this case be electrically connected directly to the control circuits 52.

Each of the emitter units 21, 22, 23 comprises a primary emitter 31 and a secondary emitter 32. The emitters 31, 32 are designed as LED units. Redundancy to the primary emitters 31 is achieved via the secondary emitters 32.

In order to address the primary emitters 31 and the assigned secondary emitters 32 of the respective emitter units 21, 22, 23, one correction circuit 4 each is provided in the emitter units 21, 22, 23. Preferably, at least a part of the correction circuits 4 is freely accessible, for example at the carrier 5 from the emission side 10. Corresponding conductor tracks 51 may be provided for electrical wiring. External electrical connection points for the display 1 are not drawn to simplify the representation.

Figure 2:
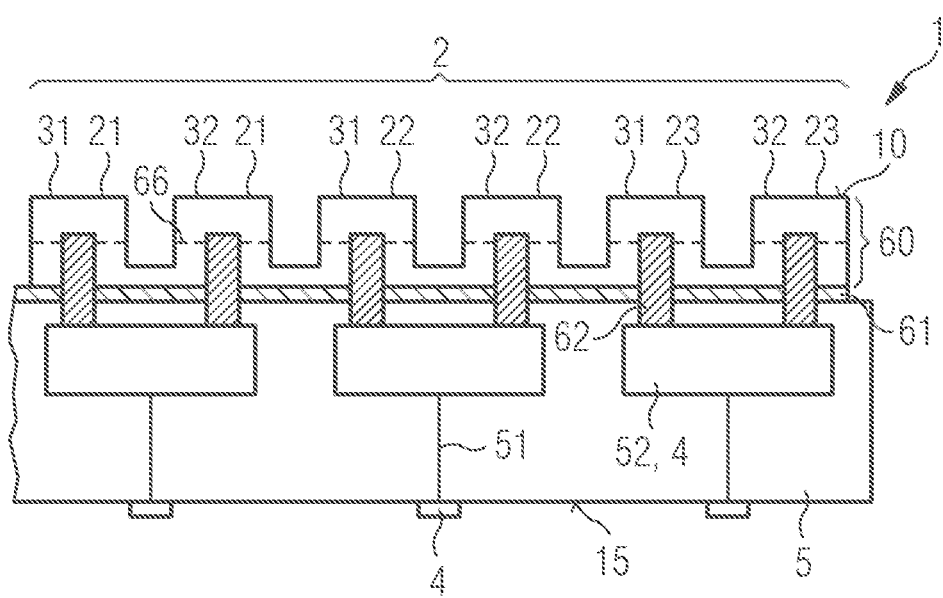
FIG. 2 shows a schematic sectional view of an exemplary embodiment of a display described here.

FIG. 2 shows another exemplary embodiment of the display 1. In contrast to FIG. 1, the semiconductor layer sequence 60 extends continuously over all emitter units 21, 22, 23, whereby the semiconductor layer sequence 60 between adjacent emitter units 21, 22, 23 is preferably removed at least through the active zone 66.

Furthermore, FIG. 2 illustrates that all emitters 31, 32 of an emitter unit 21, 22, 23 can be controlled by the same control circuit 52. Again, the emitters 31, 32 of the respective emitter units 21, 22, 23 are preferably electrically independent LED units.

Furthermore, according to FIG. 2 it is possible that parts of the correction circuits 4 on the rear side 15 are freely accessible. This allows a high fill factor of the emission side 10 with the emitter units 21, 22, 23.

If the emitters 31, 32 within the emitter units 21, 22, 23 comprise a smaller distance to each other than adjacent emitter units 21, 22, 23 to each other, it is also possible, deviating from the illustration in FIG. 2, that the respectively assigned exposed regions of the correction circuits 4 between the adjacent emitter units 21, 22, 23 are attached to the emission side 10.

The different variants of the attachment of the exposed parts of the correction circuits 4, the control circuits 52 as well as the design of the semiconductor layer sequence 60, in particular between the emitter units 21, 22, 23, as shown in FIGS. 1 and 2, may also be combined in different ways.

Figure 3:
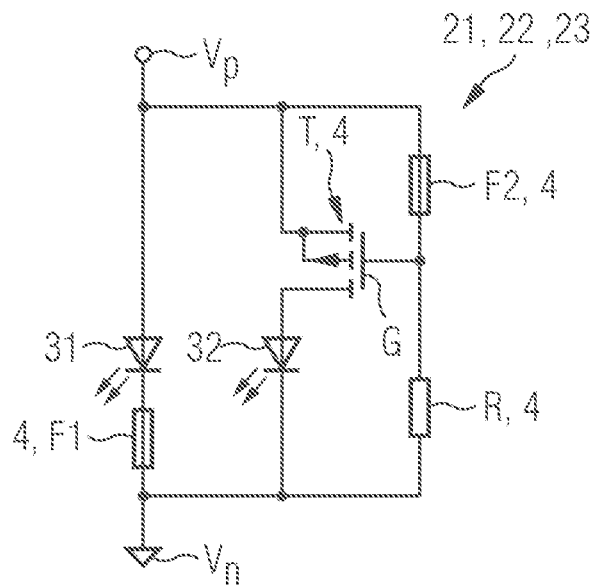
FIG. 3 shows a schematic circuit diagram of an emitter unit described here with a correction circuit for electrically parallel connected emitters.
Figure 4:
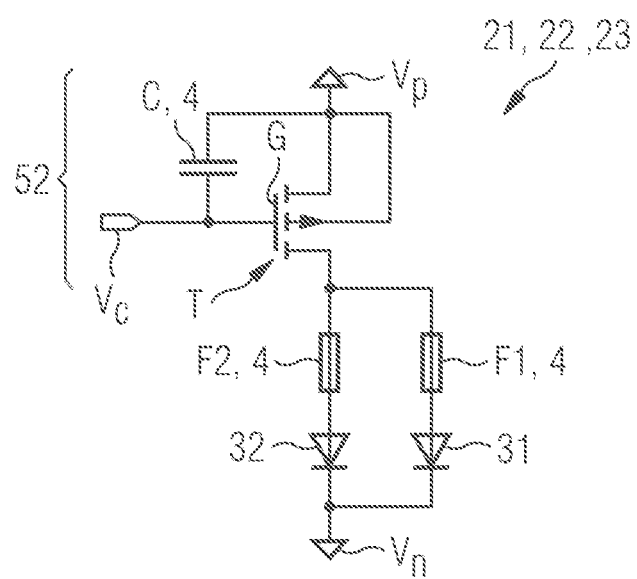
FIG. 4 shows a schematic circuit diagram of a correction circuit described here for electrically parallel connected emitters.
Figure 5:
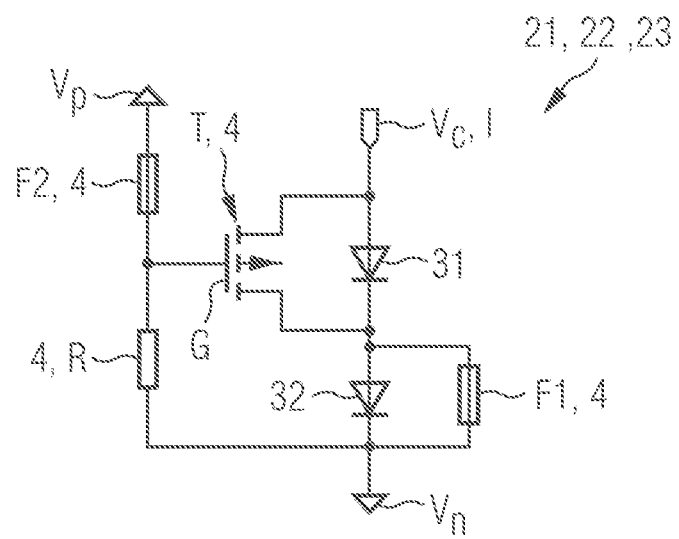
FIG. 5 shows a schematic circuit diagram of a correction circuit described here for electrically serially connected emitters.
Figure 6:
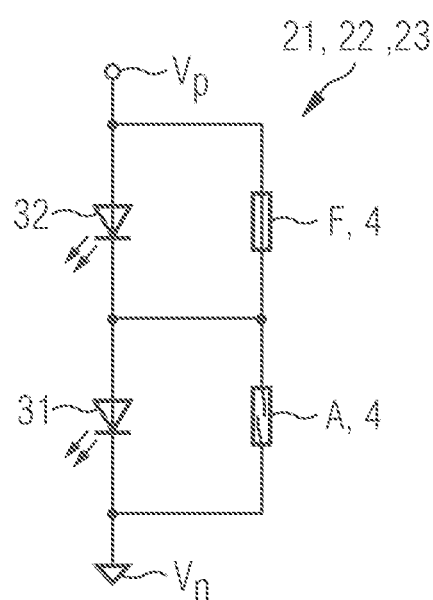
FIG. 6 shows a schematic circuit diagram of a correction circuit described here for electrically serially connected emitters.

FIGS. 3 to 6 illustrate different interconnections of the primary emitters 31 and the secondary emitters 32 with the corresponding correction circuits 4 for the emitter units 21, 22, 23. FIG. 3 shows a parallel circuit structure with a metal oxide field-effect transistor, MOS-FET for short. FIG. 4 shows a parallel circuit structure with a fuse and with a possible burn-in. FIG. 5 is directed to a series circuit structure with a MOS-FET and FIG. 6 is a series circuit structure with an antifuse.

With all examples according to FIGS. 3 to 6, "shorts", where a resistance is significantly reduced, as well as "opens", where a resistance is significantly increased compared to working emitters, can be intercepted at emitters 31, 32.

The circuit in FIG. 3 comprises the primary emitter 31 and the secondary emitter 32, which are in principle electrically connected in parallel so that the emitters 31, 32 comprise at least one common electrode. A first fuse F1 is electrically connected in series to the primary emitter 31. A transistor T1 is electrically connected in series with the secondary emitter 32, wherein the secondary emitter 32 is located along a source-drain path of the transistor T1. A control electrode G, also called gate, is connected to a positive supply voltage Vp via a second fuse F2 and to a negative supply voltage Vn via a resistor R.

In the example in FIG. 3, there is a main LED in the form of primary emitter 31, which emits light when it is functional. If the primary emitter 31 emits light during a function test, no further action is required with regard to the wiring.

If the primary emitter 31 is defective and forms a "short" or an "open", this will be detected during a test of the display 1. Thereupon the two fuses F1, F2 of the correction circuit 4 are opened in a defined manner and the assigned electrical connections are interrupted. This is carried out, for example, by a laser. By opening the fuse F2, the transistor T is switched conductive and the secondary emitter 32 can emit light as a replacement for the primary emitter 31.

The transistor T is preferably selected such that the threshold voltage of the transistor T is less than the sum of the forward voltage of the secondary emitter 32 and the voltage at the drain-source path.

By interrupting the fuse F1, for example with a laser, the primary emitter 31 is cut off. By interrupting the fuse F2, for example again with a laser, the gate-source path of the transistor T, which was previously short-circuited, is now pulled via resistor R to the negative supply voltage Vn. This makes the transistor T conductive and secondary emitter 32 can emit light.

This procedure is the same regardless of whether the primary emitter 31 shows a "short" with a reduced electrical resistance or an "open" with an increased electrical resistance as an error. As a result, the emitter units 21, 22, 23 will emit light normally, using secondary emitter 32 as a light source instead of primary emitter 31.

If both emitters 31, 32 are faulty, the fault cannot be remedied with the circuit shown in FIG. 3. If the primary emitter 31 is working, there is nothing else to do.

In the case of a comparatively ideal "open", i.e. in the case of a defective primary emitter 31 with resistance increased 31 by at least a factor of 10 or 50 or 100 or approaching infinitely compared to a functioning primary emitter, the opening of the fuse F1 can also be omitted, since the primary emitter 31 carries practically no current. In case of a "short" both fuses F1, F2 have to be opened.

In the circuit shown in FIG. 4, the emitters 31, 32 are electrically connected in parallel and each is electrically connected in series with one of the fuses F1, F2. The emitters 31, 32 are connected to a negative supply voltage Vn with low-resistance. In the corresponding series connections 31, F1 as well as 32, F2 the positions of the emitters 31, 32 and the fuses F1, F2 can be interchanged.

Towards the positive supply voltage Vp the emitters 31, 32 are connected to the transistor T. The transistor T can be the power transistor of the emitter unit 21, 22, 23. A control electrode G of the transistor T is connected to a control voltage Vc, whereby a source circuit of the transistor T can be given via a capacitor C. The control voltage Vc can be equal to the supply voltage Vp when the display 1 is in operation, but when the correction circuit 4 is actuated, the control voltage Vc is different from the supply voltage Vp. A so-called 2T1C pixel driver circuit may be present. The transistor T is preferably a MOS-FET, in particular a PFET, as also possible in all other exemplary embodiments.

Thus the transistor T corresponds to the power transistor of the subpixel 21, 22, 23 and the control voltage Vc corresponds to an input signal of the emitters 31, 32. If both emitters 31, 32 are intact, the current is divided according to the internal resistances of the LED units 31, 32. If this is not desired, one of the fuses F1, F2 could be opened by means of a laser, for example.

If one of the emitters 31, 32 is "open" in case of an error and thus shows a very high resistance, no further action is necessary. The current then flows through the intact emitter 32, 31.

If one of the emitters 31, 32, on the other hand, forms a short circuit, i.e. a "short", the positive supply voltage Vp is applied to a voltage that corresponds to the voltage drop of the emitters 31, 32 at nominal current. For example, this is about 6 V for semiconductor emitters based on InGaN for green and blue light and about 4 V for semiconductor emitters based on InGaAlP for red light.

The control voltage Vc is set to a minimum value, for example about 0.2 V, determined by the driver for the source of transistor T. Furthermore, the negative supply voltage Vn is set to 0.

Thus the voltage between gate and source at transistor T becomes maximum and current flows through the short-circuited emitter 31, 32. Depending on the design and characteristics of the short circuit, the current is preferably increased at least 2-times or 3-times, for example approximately 4-times, compared to a nominal current. Due to the comparatively high current intensity, the corresponding fuse F1, F2 is opened.

After opening the corresponding fuse F1, F2, the intact emitter 31, 32 carries the current, thus pinching off transistor T, since the voltage drop across emitter 31, 32 at the nominal current corresponds to the total available voltage drop.

In the example of FIG. 4, correction via correction circuit 4 is thus possible by purely electronic means without the need for additional external operations such as cutting fuses, in particular if emitters 31, 32 may both be operated simultaneously, provided that both emitters 31, 32 are functional. Thus, the correction circuit 4 can optionally be completely integrated into a carrier 5.

In the exemplary embodiment in FIG. 5, the emitters 31, 32 are electrically connected in series. The transistor T is connected in parallel to the primary emitter 31, the secondary emitter 32 is connected in parallel to the fuse F1. The control electrode G of transistor T is connected to the positive supply voltage Vp via a second fuse F2 and to the negative supply voltage Vn via a resistor R. Furthermore a current source I is present.

If both emitters 31, 32 are intact, the control electrode G of transistor T, which is manufactured in PMOS technology, for example, is connected to the positive supply voltage Vp via fuse F2. Thus the transistor T is switched to high resistance. If the fuse F1 is closed, the current is completely conducted only through the primary emitter 31 and no action with respect to the correction circuit 4 is necessary, in particular no laser cutting.

If the primary emitter 31 shows an "open" with an increased resistance, none of the emitters 31, 32 emit light. In this case the two fuses F1, F2 are opened, for example by laser radiation. The control electrode G of the transistor T is pulled to the negative supply voltage Vn via the resistor R, thus switching the transistor T to low-resistance. Thus, the primary emitter 31 is bridged and current is only conducted via the secondary emitter 32.

If the secondary emitter 32 shows an "open" or "short", no action is necessary.

If the primary emitter 31 shows a "short" with a reduced resistance, the procedure is analogous to the case where the primary emitter 31 shows an "open" with an increased resistance. In the "short" case, it is also possible to optionally omit the cutting of the fuse F2. Thus the practically short-circuited primary emitter 31 would not be bridged by transistor T and the current for the secondary emitter 32 would flow through the "short" of the primary emitter 31.

The control voltage Vc, the positive supply voltage Vp, the capacitor C as well as the transistor T can form a classical driver circuit for emitter units with a storage capacitor and a driver transistor and can thus form the control circuit 52. A corresponding current source can also be used in all other exemplary embodiments.

As in the exemplary embodiment of FIG. 3, an action on the correction circuit 4 is only necessary in case of an error in the example of FIG. 5. If both emitters 31, 32 are intact, only the primary emitter 31 will emit light.

In the example of FIG. 6, the emitters 31, 32 are electrically connected in series. An antifuse A is connected in parallel to the primary emitter 31 and a fuse F to the secondary emitter 32.

If the primary emitter 31 is functional, no further action is required. The antifuse A is normally non-conductive. The antifuse A is formed in such a way that it becomes conductive at voltages higher than the maximum forward voltage of primary emitter 31 plus an additional safety puffer. If the primary emitter 31 is defective, the fuse F can be opened, for example, by means of laser radiation, whereby the secondary emitter 32 is switched on as a replacement LED unit.

Thus, if the primary emitter 31 shows a "short" with a reduced resistance, the fuse F can be cut, for example by means of lasers. The previously short-circuited secondary emitter 32 can now serve as a replacement and current flows only via the secondary emitter 32 and the primary emitter 31 which is to be treated as a short.

If the primary emitter 31 shows an "open" with an increased resistance, the fuse F is interrupted by means of a laser, for example. If the current source is switched on and the primary emitter 31 is interrupted according to an "open", the current source goes into its voltage maximum, which is applied to the antifuse A. The antifuse A is switched conductive, i.e. it short-circuits due to alloying, for example. If the fuse F is interrupted, current can flow through the secondary emitter 32 and the antifuse A and the secondary emitter 32 emits light.

FIG. 7 shows a schematic representation of a fuse F. For example, the corresponding conductor track 51 comprises a constriction 59 which heats up and melts at a certain current level, causing the conductor track 51 to be interrupted.

There is also the possibility to cut open the fuse F by migration, which is different from thermal melting. This effect is called electromigration and could be used to separate conductor tracks by migration instead of melting them by overheating.

FIG. 8 illustrates that the emitter units 21, 22, 23 of display 1 are formed by separate LED chips 7. Depending on the desired emission color, the LED chips 7 can be based on different material systems, for example InGaN with different indium contents for generating blue and green light and InAlGaP for generating red light. In all other respects, the explanations in FIGS. 1 to 7 apply accordingly.

Also in the exemplary embodiment of FIG. 9, the emitter units 21, 22, 23 are each formed by separate LED chips 7. The correction circuits 4 as well as the control circuits 52 can be at least partially integrated in carrier 5. The emitters 31, 32 can be electrically controlled individually via the first contact electrodes 61. In addition, the emitters 31, 32 have a common second contact electrode 62, which is in particular formed as a common cathode.

For this purpose, a transparent conductive layer 63 is formed over the emitter units 21, 22, 23 starting from metallic connection points of the second contact electrode 62. The transparent conductive layer 63 is made of ITO, for example. The transparent conductive layer 63 is preferably a component of the correction circuits 4.

Optionally, a filling 64 is provided between the emitters 31, 32 for planarization. The filling 64 is preferably transparent or opaque, in particular black. To increase the contrast between pixels 2, the filling 64 is preferably non-reflective, especially not diffusely reflective.

In the top view of FIG. 10, which is based on FIG. 9, a possible realization of a circuit is illustrated, in particular the circuit of FIG. 3. With laser cuts 81 the defective primary emitters 31 are cut free from the layer 63 which serves as common cathode. This corresponds to cutting the fuse F1 in FIG. 3. Preferably at the same time the fuse F2 is cut, which can run underneath the fuse F2. Thus advantageously the fuse F2 is placed underneath the laser cut region provided for the fuse F1, in order to cut through both fuses F1 and F2 with only one cut. This saves process time.

In general, the prerequisite for the laser cuts 81 is that the laser is set in such a way that it cuts only fuse F1 and/or fuse F2 and no other functional components. Advantageously all important electrical lines and/or components, for example, that are not to be damaged by the laser are placed where no laser cut is intended.

FIG. 11 illustrates variations on FIG. 10. In the emitter unit 21, fuse F2 is placed through the laser cut region for fuse F1 in order to separate both fuses F1 and F2 with only one cut. The fuse F2 can be guided through the laser cut region in various forms.

An alternative design for the fuse F2 is illustrated for emitter unit 22. Here, the fuse F2 is cut with a separate laser cut 82.

Based on FIG. 9, FIG. 12 shows a realization of the circuit from FIG. 4. Both anode conductor tracks for the primary emitter 31 and for the secondary emitter 32 can act as migration fuses, each shown here as a constriction.

The invention described here is not limited by the description using the exemplary embodiments. Rather, the invention comprises each new feature as well as each combination of features, which in particular includes each combination of features in the claims, even if this feature or combination itself is not explicitly specified in the claims or exemplary embodiments.

This patent application claims the priority of the German patent application 10 2018 120 730.1, the disclosure content of which is hereby incorporated by reference.

REFERENCES

1 Display
10 Emission side
15 Rear side
2 Pixel
21, 22, 23 Emitter unit
31 Primary emitter
32 Secondary emitter
4 Correction circuit
5 carrier
51 conductor tracks
52 control circuit
59 constriction 60 Semiconductor layer sequence
61 first contact electrode
62 second contact electrode
63 transparent conductive layer
64 filling
66 active zone
7 LED chip
81 laser cut
82 laser cut
A Antifuse
C capacitor
F fuse
G control electrode of the field-effect transistor
I current source
R resistor
T field-effect transistor
Vc control voltage
Vn negative supply voltage
Vp positive supply voltage

The invention claimed is:

1. A display comprising a plurality of pixels, wherein
at least some of the pixels comprise an emitter unit,
the emitter units each comprise a primary emitter and a secondary emitter for generating light of the same color and the secondary emitter is associated with the primary emitter,
the primary emitters and the secondary emitters are based on at least one semiconductor material
each emitter unit comprises a correction circuit,
the correction circuit is configured to be able to switch the generation of light from the primary emitter to the associated secondary emitter in case of a defect of the primary emitter,
the primary emitter and the associated secondary emitter are electrically connected in series, and
in each emitter unit, an antifuse is electrically connected in parallel with the primary emitter and a fuse is electrically connected in parallel with the secondary emitter, or
in each emitter unit a field-effect transistor is electrically connected in parallel with the primary emitter and a fuse is electrically connected in parallel with the secondary emitter, or
a control electrode of the field-effect transistor is connected to a negative supply voltage and to a positive supply voltage as long as the correction circuit is not actuated, and the control electrode is connected via a resistor only to the negative supply voltage when the correction circuit has been actuated.

2. The display according to claim 1, in which the secondary emitters are each uniquely assigned to a primary emitter and the primary emitters and secondary emitters assigned to one another are identical in construction.

3. The display according to claim 1, in which the secondary emitter of the respective emitter unit does not emit light as long as the correction circuit is not actuated.

4. The display according to claim 1, in which the correction circuit comprises at least one transistor, at least one fuse and at least one antifuse.

5. A display comprising a plurality of pixels, wherein
at least some of the pixels comprise an emitter unit,
at least some of the pixels comprise subpixel for the generation of green light, red light, and blue light,
each emitter unit forms a subpixel,
each emitter unit comprises a primary emitter and a secondary emitter for generating light of the same color and the secondary emitter is associated with the primary emitter,
the primary emitters and the secondary emitters are based on at least one semiconductor material,
the emitter units each comprise a correction circuit,
the correction circuit is configured to be able to switch the generation of light from the primary emitter to the associated secondary emitter in case of a defect of the primary emitter, and
the primary emitter and the associated secondary emitter are connected to a common electrode with low-resistance.

6. The display according to claim 5, in which a first fuse and the primary emitter are electrically connected in series,
wherein the secondary emitter and a field-effect transistor are electrically connected in series.

7. The display according to claim 6, in which a control electrode of the field-effect transistor is connected to a positive supply voltage via a second fuse and to a negative supply voltage via a resistor,
wherein, if the correction circuit has not yet been actuated, the fuses are still connected through.

8. The display according to claim 5, in which the primary emitter and the secondary emitter are each electrically connected in series to a fuse,
wherein the primary emitter and the secondary emitter are each electrically connected to a field-effect transistor with low-resistance as long as the correction circuit has not yet been actuated.

9. The display according to claim 8, in which the field-effect transistor provided for actuating the correction circuit is at the same time a power transistor for the associated emitter unit.

10. The display according to claim 5, in which each correction circuit of the emission units is at least partially freely accessible from one emission side of the display.

11. The display according to claim 5, in which each correction circuit of the emission units is at least partially freely accessible from a rear side of the display and no light generated in the display is emitted at the rear side in intended operation.

12. A manufacturing method for a display according to claim 1, the method comprising the following steps in the order given:
providing of the emitter units with the correction circuits, wherein the correction circuits have not yet been actuated,
testing the emitter units, determining whether at least one primary emitter is defective, and
actuating at least those correction circuits to which a defective primary emitter is assigned so that the associated secondary emitter is permanently configured to generate light,
wherein
in each emitter unit, the antifuse is electrically connected in parallel with the primary emitter and the fuse is electrically connected in parallel with the secondary emitter, or
in each emitter unit the field-effect transistor is electrically connected in parallel with the primary emitter and the fuse is electrically connected in parallel with the secondary emitter, or the control electrode of the field-effect transistor is connected to the negative power supply voltage and to the positive supply voltage as long as the correction circuit is not actuated, and the control electrode is connected via the resistor only to the negative supply voltage when the correction circuit has been actuated, or the primary emitter and the associated secondary emitter are connected to a common electrode with low-resistance.

13. The method according to claim 12,
wherein the at least one defective primary emitter exhibits an electrical resistance increased by at least a factor 3 or reduced by at least a factor 2 with respect to functional primary emitters.

14. The display according to claim 1, wherein each correction circuit of the emission units is at least partially freely accessible from one emission side of the display.

15. The display according to claim 1, wherein each correction circuit of the emission units is at least partially freely accessible from a rear side of the display and no light generated in the display is emitted at the rear side in intended operation.

\* \* \* \* \*